(12) United States Patent
Oita et al.

(10) Patent No.: US 7,088,032 B2
(45) Date of Patent: Aug. 8, 2006

(54) CRYSTAL OSCILLATOR

(75) Inventors: Takeo Oita, Sayama (JP); Minoru Fukuda, Sayama (JP)

(73) Assignee: Nihon Dempa Kogyo Co., Ltd., Sayama (JP)

( * ) Notice: Subject to any disclaimer, the term of this patent is extended or adjusted under 35 U.S.C. 154(b) by 0 days.

(21) Appl. No.: 11/154,289

(22) Filed: Jun. 16, 2005

(65) Prior Publication Data

US 2005/0285482 A1 Dec. 29, 2005

(30) Foreign Application Priority Data

Jun. 29, 2004 (JP) ............................. 2004-191826

(51) Int. Cl.
*H01L 41/08* (2006.01)
(52) U.S. Cl. ...................... 310/343; 219/210
(58) Field of Classification Search ................ 310/343; 219/209, 210
See application file for complete search history.

(56) References Cited

U.S. PATENT DOCUMENTS

| | | | |
|---|---|---|---|
| 4,259,606 A * | 3/1981 | Vig | 310/343 |
| 5,041,800 A * | 8/1991 | Long et al. | 331/69 |
| 5,696,423 A | 12/1997 | Dydyk et al. | |
| 5,917,272 A * | 6/1999 | Clark et al. | 310/343 |
| 6,049,256 A * | 4/2000 | Fry | 331/69 |
| 6,060,692 A | 5/2000 | Bartley et al. | |
| 6,133,674 A * | 10/2000 | Fry | 310/343 |
| 6,147,565 A * | 11/2000 | Satoh et al. | 331/70 |
| 6,501,340 B1 * | 12/2002 | Flood | 331/69 |
| 6,731,180 B1 * | 5/2004 | Clark et al. | 331/176 |

FOREIGN PATENT DOCUMENTS

| | | |
|---|---|---|
| EP | 0825717 | 2/1998 |
| EP | 0969591 | 1/2000 |

* cited by examiner

*Primary Examiner*—Mark Budd
(74) *Attorney, Agent, or Firm*—Greer, Burns & Crain, Ltd.

(57) ABSTRACT

A crystal oscillator of the present invention includes: a substrate provided in a package; a heating device arranged as surrounding an internal area of the substrate on at least one of the surfaces of the substrate; a crystal resonator or a crystal element and an oscillation circuit unit provided in an area enclosed by the heating device; a thermosensitive element which detects a temperature in an area enclosed by the heating device; and a control unit for controlling a heating value applied to the heating device based on a detection result of the thermosensitive element.

11 Claims, 8 Drawing Sheets

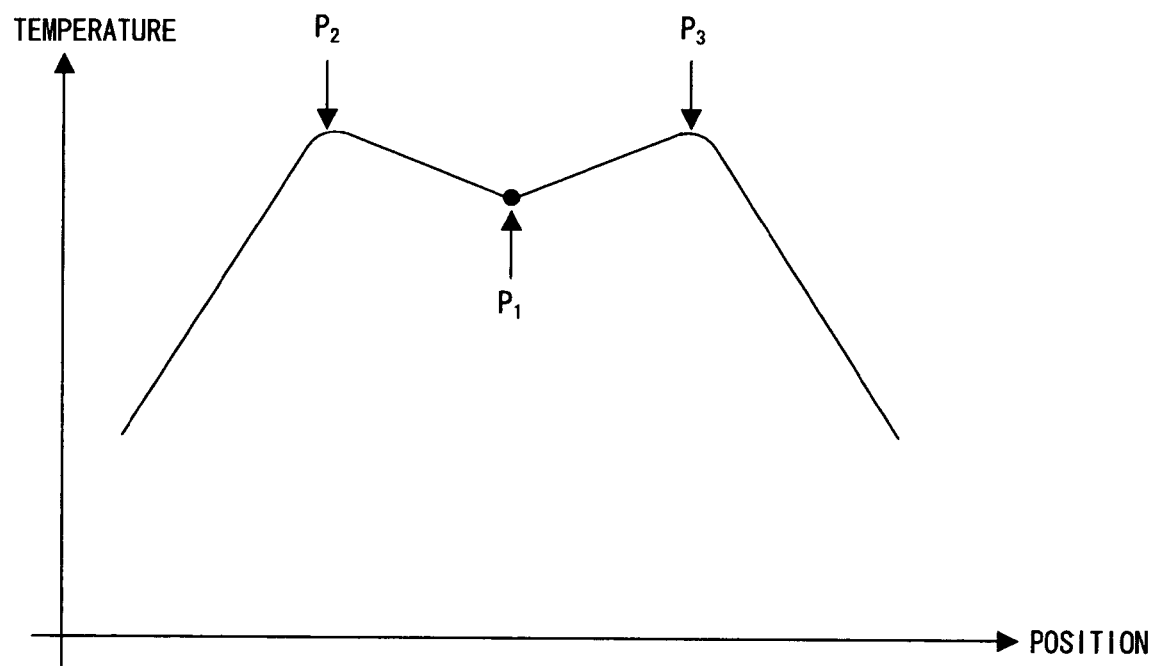
F I G. 4

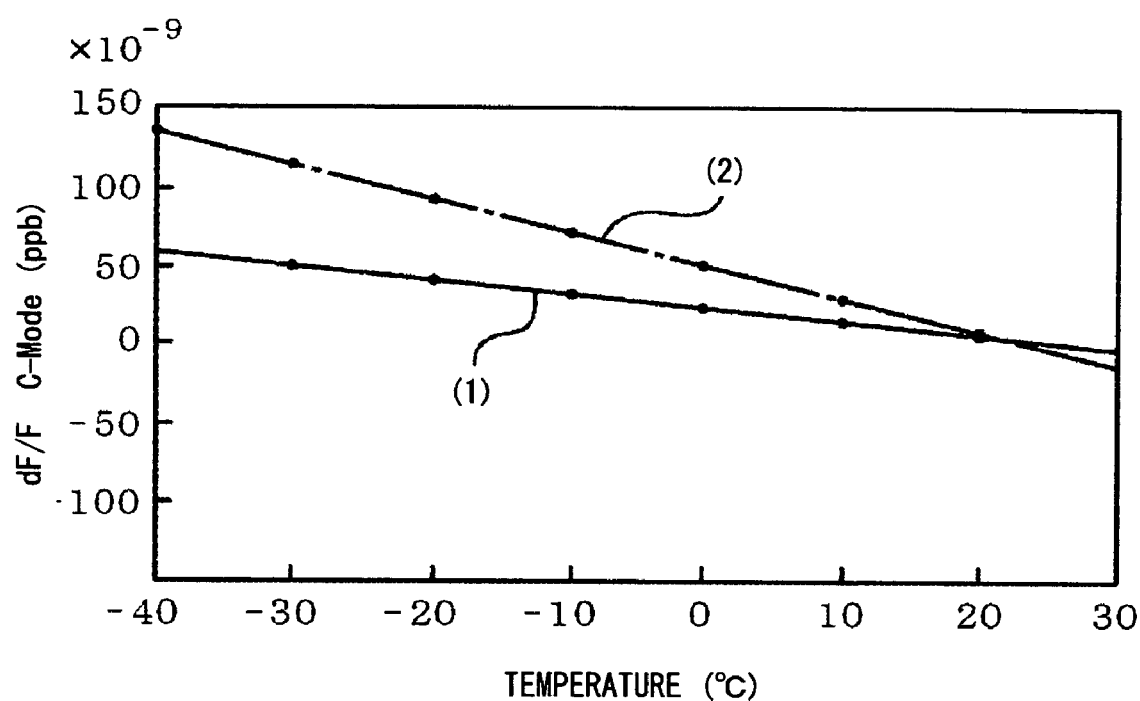
F I G. 6

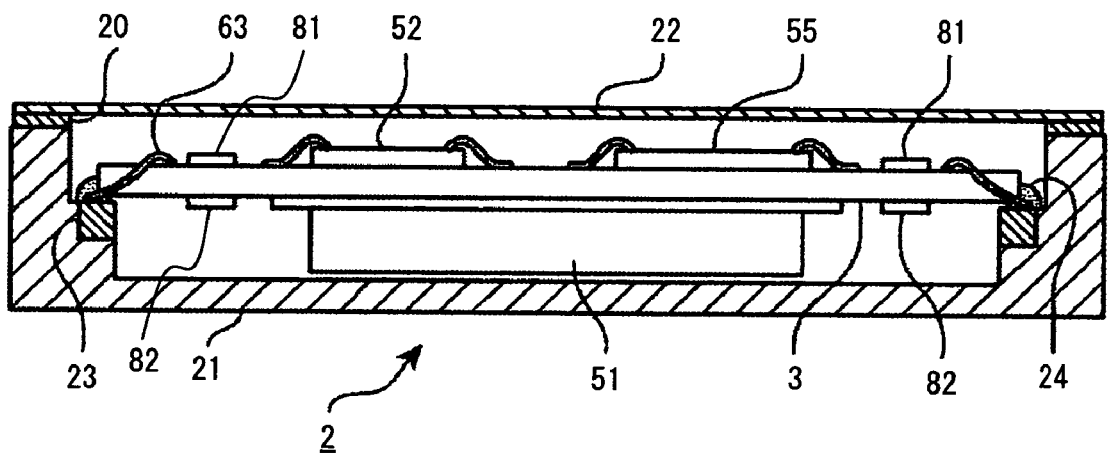
F I G. 7

CRYSTAL OSCILLATOR

BACKGROUND OF THE INVENTION

1. Field of the Invention

The present invention relates to a crystal oscillator for stabilizing the frequency to the ambient temperature variations using a thermosensitive element and a heating device.

2. Description of the Related Art

A crystal oscillator for stabilizing the frequency to ambient temperature variations can be of well-known OCXO (oven-controlled crystal oscillator) and TCXO (temperature compensated crystal oscillator) types. The OCXO type encloses a crystal element and a peripheral circuit in a package, and the entire package is covered with a heater, thereby stabilizing the temperature of the crystal element to the ambient temperature variations and excelling in the temperature characteristic, but having the disadvantage of large power consumption and long warm-up time. On the other hand, the TCXO type is provided with an temperature characteristic compensation circuit in a peripheral circuit to compensate for an oscillation frequency based on the temperature detection value of a thermosensitive element, thereby requiring smaller power consumption and shorter warm-up time than the OCXO type, but having lower temperature stability.

Thus, a structure having better temperature characteristic and requiring no larger power consumption than the TCXO, that is, an intermediate structure between the OCXO type and the TCXO type, has been proposed (patent document 1). FIG. 1 shows a crystal resonator of a crystal oscillator described in the patent document 1. The crystal resonator portion is installed inside a package 11 formed by a base 11a and a cover body 11b. A substrate 12 is formed in the package 11, and crystal elements 13a and 13b are arranged at the positions opposite each other on one side of the substrate 12 with a clearance between them. A heater 14 is provided at the center of the substrate 12, and the heater 14 is heat controlled based on the temperature detection value of a thermosensitive element 15 mounted near the heater 14. The oscillation circuit unit is provided outside the package 11, and the oscillation circuit unit is enclosed by an external package not shown in the attached drawings. With the above-mentioned configuration the thermosensitive element 15 can detect a change of an ambient temperature, the heating value of the heater 14 can be adjusted, and the temperature of the crystal elements 13a and 13b can be stabilized with a very simplified configuration.

However, the crystal oscillator of the patent document 1 has the following problems. That is, when the ambient temperature changes, the temperature of the external package not shown in the attached drawings also changes, and then the temperature of the internal package 11 changes, thereby sequentially changing the temperatures of the structure and parts. In this case, the temperature change transmits inwards. Since the heater 14 is positioned below the center of the crystal elements 13a and 13b and near the thermosensitive element 15, and the position of the crystal elements 13a and 13b is different from the position of the oscillation circuit, the temperature difference between the crystal elements 13a and 13b and the oscillation circuit becomes large while heat flows from the side of the oscillation circuit, and is transmitted to the crystal elements 13a and 13b inside the internal package 11. In the meantime, it takes a long time to transmit the temperature change to the center, allow the temperature control effect by the heater 14 to work, and allow the effect of suppressing the temperature change to spread from the heater to the entire device.

Additionally, from the configuration shown in FIG. 1, the ambient temperature change is first received by the crystal elements 13a and 13b, and then by the thermosensitive element 15, and the heater 14 controls the heat. However, although the heater 14 radiates heat to the crystal elements 13a and 13b, the heat is transmitted to the crystal elements 13a and 13b mainly through the substrate 12 and a fixing member 16. Therefore, it takes quite a long time to cancel the temperature change received by the crystal elements 13a and 13b.

Thus, if a temperature difference can be easily made between the crystal elements 13a and 13b and the oscillation circuit and there is poor response for stabilizing the temperature of the crystal elements 13a and 13b, then the oscillation frequency from the crystal oscillator becomes unstable, and if an external temperature is different, the rate of the temperature change of each unit is also different. Therefore, when a practical operation is performed, the crystal oscillator cannot be guaranteed as a stable device.

Furthermore, since the above-mentioned structure is generated based on the concept of controlling the temperature of the crystal elements 13a and 13b directly by the heater 14, the crystal elements 13a and 13b are uncovered. Since the uncovered crystal elements 13a and 13b, heater 14, thermosensitive element 15, etc. are arranged in the same package 11, it is necessary to remove the particles and volatile components spread from each part and adhere to the crystal elements 13a and 13b during the production process. As a result, before the parts are enclosed in the package 11, the crystal elements 13a and 13b have to be treated in a cleaning process by complicatedly combining UV-cleaning, plasma-cleaning, etc. with each part assembled on the base 11a, thus requiring the additional cost for the process.

[Patent Document 1] U.S. Pat. No. 5,917,272, FIGS. 1 through 5

SUMMARY OF THE INVENTION

The present invention aims at providing a crystal oscillator which can be easily mass-manufactured, reduce the power consumption, and be stable in oscillation frequency to the ambient temperature variations.

The crystal oscillator according to the first aspect of the present invention includes: a substrate provided in a package; a heating device arranged as surrounding the internal area of the substrate on at least one of the surfaces of the substrate; a crystal resonator and an oscillation circuit unit provided in an area enclosed by the heating device; a thermosensitive element which detects the temperature in an area enclosed by the heating device; and a control unit for controlling the heating value applied to the heating device based on a detection result of the thermosensitive element.

Since the crystal resonator, the oscillation circuit unit, the thermosensitive element, etc. are provided in an area enclosed by the heating device, the ambient temperature variations are attenuated by the heating device and transmitted inwards. As a result, since the temperature variations of the crystal resonator and the oscillation circuit unit are small, and the temperature inclination in the internal area can be reduced, the change in oscillation frequency of the crystal oscillator by the ambient temperature variations is small, thereby stabilizing the temperature characteristic of the frequencies. Additionally, since the temperature inclination is reduced, the amount of heating required in maintaining the temperature can be reduced, and the power consumption can be reduced. Furthermore, since the heating device is arranged as surrounding the crystal resonator and the oscillation circuit unit on at least one of one surface and another of the substrate, the mass-production of the crystal oscillator can be more easily realized than the conventional technology in which, for example, a heating device is wound on a crystal element in a spiral fashion.

It is preferable that a heating device is arranged to enclose an internal area of a substrate along the circumference of the area continuously and entirely, but it also can be arranged to continually enclose the internal area substantially as a number of islands enclosing the substrate. The heating device can be, for example, a resistance heater layer formed by applying a thick film of paste or evaporating a thin metal film.

A practical example of the configuration of the present invention can be a substrate supported outside a heating device with the parts of the substrate not touching the package. The outside includes the case where the outline of the heating device is positioned outside the supporting portion of the substrate. For example, when a heating device is a belt-shaped device, the substrate can be supported outside the inner contour of the heating device. It is preferable that the package is vacuum-sealed so that the devices of the substrate can be thermally cut off from the external units, but it is also possible to charge a heat insulator, for example, resin foam.

It is also possible to provide a heating device in an area enclosed by another heating device. For example, a first belt-shaped heating device encloses the inside (area) of a substrate, and the inside (area) of the substrate is further enclosed by another belt-shaped heating device as a double configuration or a triple or further multiple configurations. Additionally, a heating device can be provided for the entire area enclosed by the above-mentioned first belt-shaped heating device (in this case, the heating device is provided for almost the entire substrate).

The method of manufacturing the crystal oscillator according to the second aspect of the present invention includes: arranging a heating device as surrounding the internal area of the substrate on at least one of the surfaces of the substrate; and arranging in the area enclosed by the heating device a crystal resonator or a crystal element, an oscillation circuit unit, a thermosensitive element which detects the temperature in the area, and a control unit for controlling the heating value applied to the heating device.

BRIEF DESCRIPTION OF THE DRAWINGS

FIG. 4 shows the outline of the temperature distribution of the section of the crystal oscillator according to the present embodiment shown in FIG. 2;

FIG. 6 is an explanatory view showing the effect of the embodiment of the present invention;

FIG. 7 is a plan view showing another embodiment of the crystal oscillator of the present invention.

DESCRIPTION OF THE PREFERRED EMBODIMENTS

Figure 2:
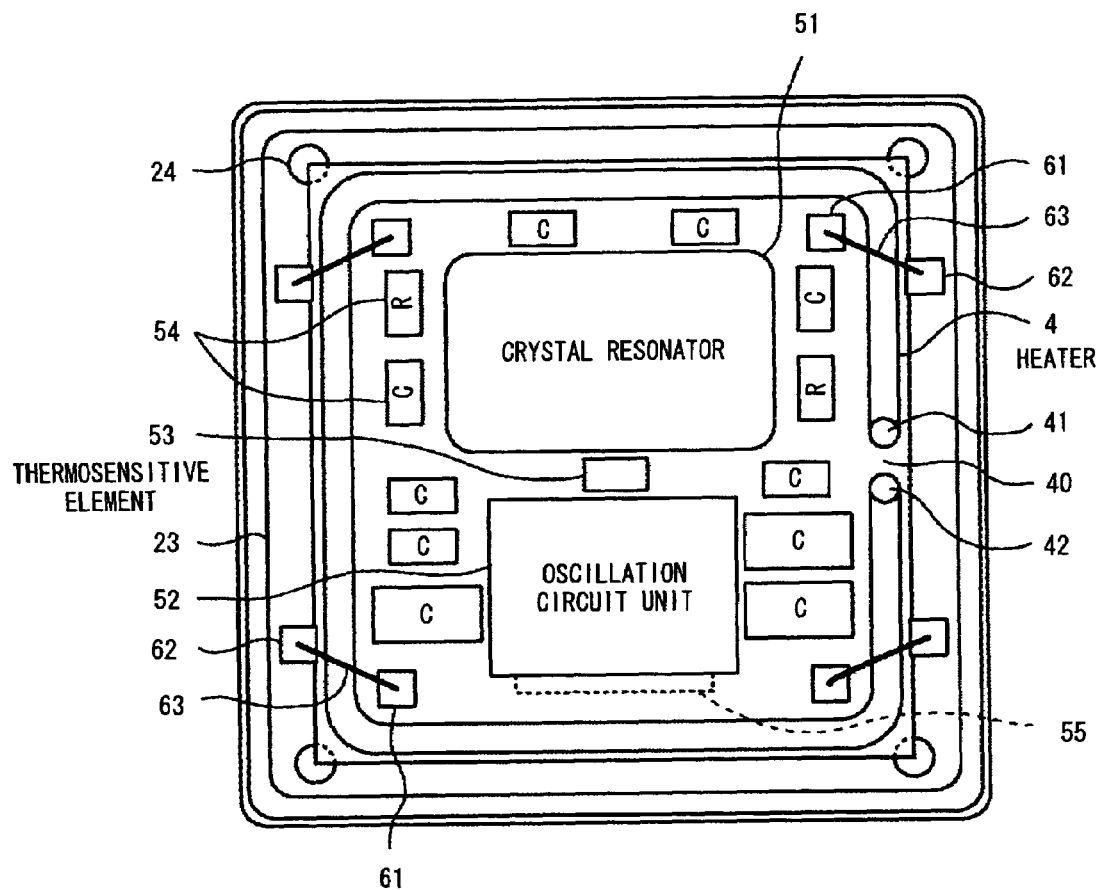
FIG. 2 is a cross-sectional plan view showing an embodiment of the crystal oscillator according to the present invention.
Figure 3:
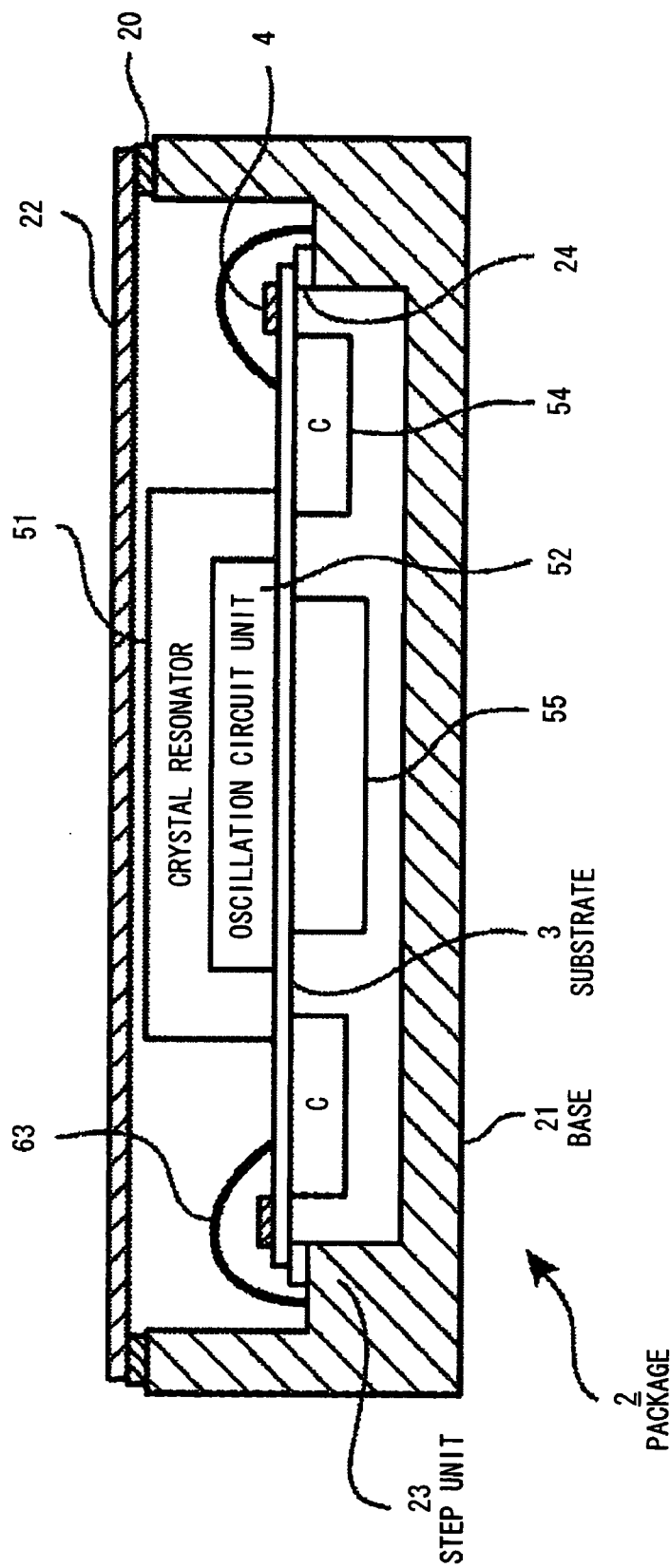
FIG. 3 is a sectional side view showing the embodiment of the present invention.

FIGS. 2 and 3 are respectively a cross-sectional plan view and a sectional side view of the crystal oscillator according to an embodiment of the present invention. In FIG. 3, a package 2 is a container (package) of airtight structure configured as an external structure of a crystal oscillator. The package 2 is configured as a box-shaped and open-top base 21 of material of low thermal conductivity, for example, ceramics, and a cover unit 22 of, for example, a metal plate covering the top of the base 21 using an adhesive 20. The package 2 is vacuum-sealed in this example to make a heat insulating structure to an external unit. The base 21 contains a step unit 23 along the entire circumference. On the step unit 23, a circumference unit of a substrate 3 of a material of low thermal conductivity, for example, glass is supported through an adhesive 24. Instead of supporting the entire circumference of the substrate 3 using the base 21, a point supporting structure such as a glass stud can also be used.

On one surface (the "top surface" in the explanation of the present embodiment) of the substrate 3 shown in FIG. 3, a heater 4 comprising, for example, a belt-shaped resistance heater layer forming a heating device along the circumference of the substrate 3 is provided for almost the entire circumference of the substrate 3 with a clearance 40 for only one point in this example. Terminal units 41 and 42 are terminal units of the heater 4. The resistance heater layer can be formed by, for example, evaporating a thin metal film or applying a thick film of paste. The resistance heater layer can be multiple belt-shaped units.

The area enclosed by the heater 4 on the top surface of the substrate 3 is provided with a crystal resonator 51, an oscillation circuit unit 52 having an integrated circuit, a thermosensitive element 53 forming a temperature detection unit, and a peripheral circuit component 54. The thermosensitive element 53 is arranged at the center of the substrate 3 to detect an external temperature change from outside the package 2 with the same timing in any transmission direction of the temperature change. The crystal resonator 51 and the oscillation circuit unit 52 are arranged at the positions opposite each other through the thermosensitive element 53. The crystal resonator 51 is enclosed in the package of an airtight structure for a metal crystal resonator in this example. The "C" and "R" of the peripheral circuit component 54 respectively indicate a capacitor and a resistor.

On the bottom surface of the substrate 3, a temperature control unit 55 formed by an integrated circuit for controlling a temperature and a peripheral circuit component 54 are mounted. The temperature control unit 55 controls the amount of heating of the heater 4 such that the temperature detection value of the thermosensitive element 53 can be a set value based on the temperature detection value (temperature detection result) detected by the thermosensitive element 53. In the substrate 3 and near the inner circumference of the heater 4, an inside terminal 61 which is an electric connection portion to an external unit for the oscillation circuit unit 52, etc. is provided at, for example, the four corners inside the heater 4. At the four corners on the step unit 23 of the base 21, an outside terminal 62 is provided, and each inside terminal 61 and the corresponding outside terminal 62 are electrically connected through bonded wire 63.

Described below are the operation and the effect of the above-mentioned embodiment of the present invention. Assuming that the ambient temperature has been changed, for example, the temperature has dropped, the temperature change is transmitted to the package 2. However, since the package 2 is vacuum-sealed, the thermal transmission path to the circuit devices on the substrate 3 is mainly the thermal transmission from the step unit 23 of the base 21 to the substrate 3. The temperature change of the base 21 is normally transmitted from the circumference of the substrate 3 to the internal area. However, since the heater 4 is on the circumference of the substrate 3, the temperature change is transmitted to the heater 4. In this example, the temperature of the heater 4 drops. Therefore, since the temperature of the internal area enclosed by the heater 4 drops, the thermosensitive element 53 detects the temperature change (drop of the temperature). As a result, the heating value of the heater 4 becomes large by the controlling operation of the temperature control unit 55 and the temperature detection value of the thermosensitive element 53 is controlled to be a set value, and the temperature is normally returned to the original temperature.

Therefore, the temperature of the internal area temporarily drops by the influence of the transmition of the change of temperature. However, since the heater 4 is mounted around the internal area, the temperature difference in the internal area can be reduced. And the temperature gradient of the internal area of the package can be reduced. The temperature change from the external area is directly transmitted through a conductive path electrically connecting the substrate 3 with the external area. However, since the conductive path is configured by the wire 63, the heating value is small, and the temperature change affecting the internal area through the wire 63 can be almost ignored. The temperature change of the crystal resonator 51 and the oscillation circuit unit 52 is very small, and the change by the oscillation frequency of the crystal oscillator is also small, thereby stabilizing the temperature characteristic.

Furthermore, since the external area is thermally insulated by maintaining the package 2 in the vacuum-sealed state, the thermal conductivity between the internal parts and the bottom and upper surface portions (cover unit 22) is also very small. Therefore, the heat radiation can be reduced and the power consumption of the heater 4 can also be reduced. Additionally, since the heater 4 is not provided for the entire package 2, but around the circumference of the substrate 3 as a belt-shaped unit, the power consumption of the heater 4 can also be reduced, and the pattern of a heater can be formed simultaneously with other patterns on the substrate, thereby easily realizing the mass-production.

In the present embodiment, a packaged crystal resonator, or a crystal element can be used in a crystal oscillator. When a crystal element is used, it is necessary to perform a cleaning process such as UV cleaning, plasma cleaning, etc. to avoid the pollution by particles and volatile components from other parts.

Figure 5:
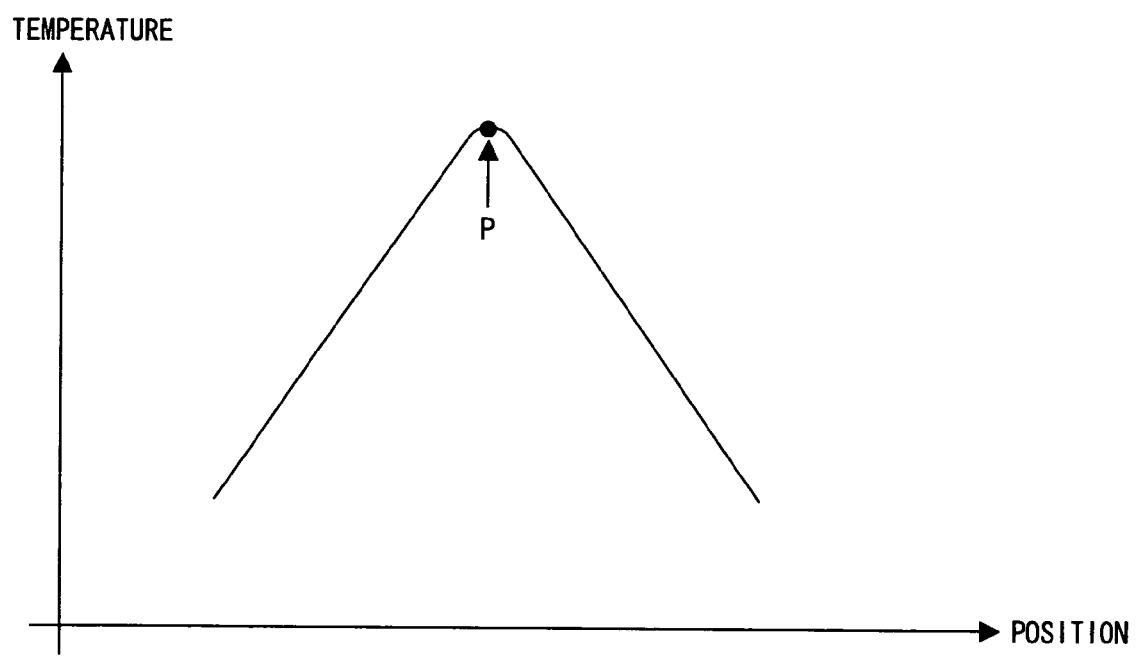
FIG. 5 shows the outline of the temperature distribution of the section of the crystal oscillator according to the conventional technology shown in FIG. 1.

In the present embodiment, when viewed from the section of the substrate as shown in FIG. 4, there are peak values of the temperature at the positions P2 and P3 of the heater (heating device). However, since an area enclosed by the heating device is appropriately large, a thermosensitive element, for example, a thermostat, positioned at the center (position P1) of the area is located farthest from the heater in the area. Therefore, the influence of the heater is relatively small, and the ambient temperature variations of the crystal oscillator can be detected at an earlier stage than with the configuration of the conventional technology shown in FIG. 1. In the temperature distribution of FIG. 5 (the temperature distribution of the conventional technology shown in FIG. 1), the oscillation circuit unit, (temperature) control unit, circuit components, etc. arranged around the crystal element or the crystal resonator show a considerable drop in temperature. In the meantime, according to the present embodiment, as shown in FIG. 4, the temperature is kept almost constant. The change in oscillation frequency against a change in ambient temperature is checked between the configuration of the conventional technology in which heat is partially applied by winding the heating device, for example, in a spiral fashion only on the crystal element or the crystal resonator that mainly have an influence on the stability of the oscillation frequency and the configuration of the present embodiment in which not only the crystal resonator, but also the oscillation circuit unit, the circuit components, etc. are heated by forming an appropriate pattern on at least one of one surface and another of the substrate.

Figure 1:
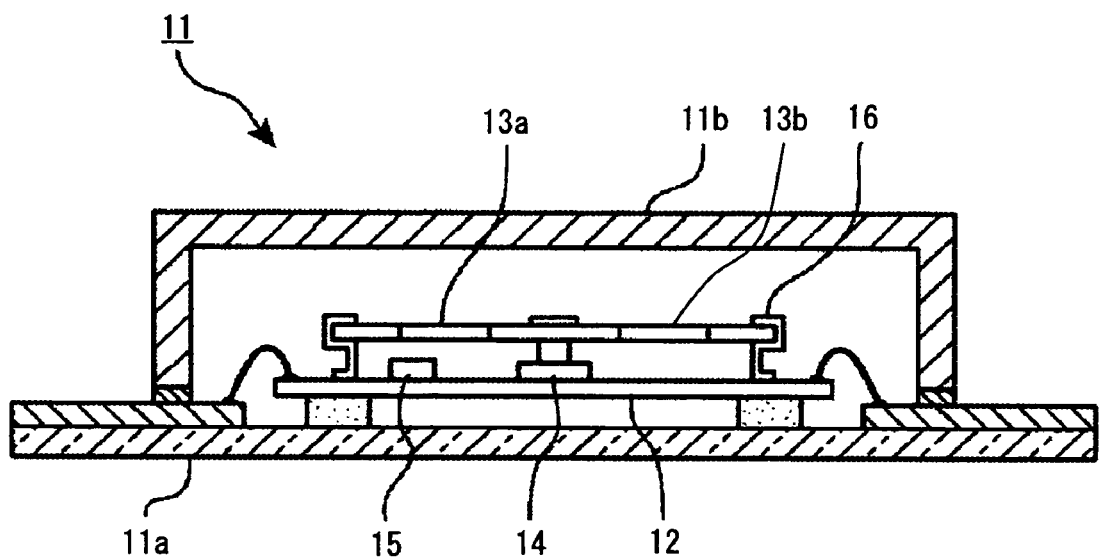
FIG. 1 is a sectional side view of the conventional crystal oscillator.

That is, regarding to the case (embodiment) where the crystal resonator and the oscillation circuit is temperature-controlled by the heater 4 with the configuration shown in FIG. 2 and the case (compared case) where only the crystal resonator is specifically temperature-controlled with the structure with the configuration shown in FIG. 1, the frequency change rate is checked in increments of 10° C. of the ambient temperature from −40° C. to 30° C., and the result shown in FIG. 6 is obtained. In FIG. 6, the main mode when the crystal resonator oscillates is displayed along the vertical axis. A crystal resonator of an external power source of 5V and a resonant frequency of 5 MHz is used. The solid line (1) indicates the result of the embodiment, and the chain line (2) indicates the result of the compared case. As shown in the results, the frequency change to the temperature change is small by enclosing the internal area of the substrate by the substrate 3, thereby guaranteeing the high accuracy in nano-order.

Figure 8:
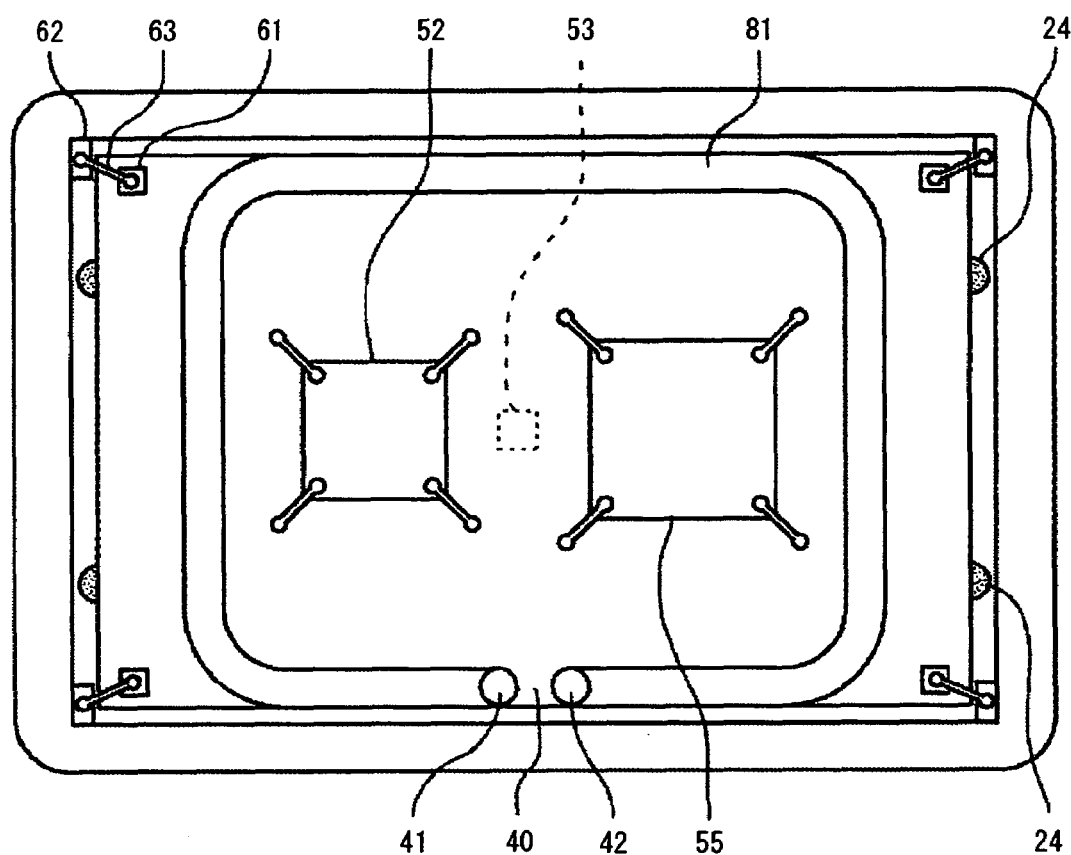
FIG. 8 is a sectional side view showing the other embodiment of the present invention.

FIGS. 7 and 8 show other embodiments of the present invention. The same portions as in FIGS. 2 and 3 are assigned the same reference numerals. In this example, both surfaces of a substrate 3 are provided around the circumference with heaters 81 and 82. The oscillation circuit unit 52 and the temperature control unit 55 are provided for the area enclosed by the heater 81 on the upper surface of the substrate 3, and the crystal resonator 51 and the thermosensitive element 53 are provided for the area enclosed by the heater 82 on the bottom surface of the substrate 3. With this configuration, the effect obtained by the above-mentioned embodiment can be realized.

What is claimed is:

1. A crystal oscillator, comprising:
   a substrate provided in a package;
   a heating device arranged as surrounding an internal area of the substrate on at least one of the surfaces of the substrate;
   a crystal resonator or a crystal element and an oscillation circuit unit provided in an area enclosed by the heating device;
   a thermosensitive element which detects a temperature in an area enclosed by the heating device; and
   a control unit for controlling a heating value applied to the heating device based on a detection result of the thermosensitive element,
   wherein the crystal resonator and the oscillation circuit unit are arranged at positions opposite to each other and have the thermosensitive element therebetween.

2. The crystal oscillator according to claim 1, wherein the heating device has a pattern of being formed in two-dimensions on at least one of the surfaces of the substrate surrounding the internal area of the substrate.

3. The crystal oscillator according to claim 1, wherein:
the substrate is supported by an external portion to the heating device; and
components mounted on the substrate do not touch the package.

4. The crystal oscillator according to claim 1, wherein the heating device is configured by a resistance heater layer.

5. The crystal oscillator according to claim 2, wherein the heating device is a thick film of paste on the substrate.

6. The crystal oscillator according to claim 2, wherein the pattern is formed by evaporating a thin metal film on the substrate.

7. The crystal oscillator according to claim 1, wherein the package is vacuum-sealed.

8. The crystal oscillator according to claim 1, wherein the package is charged with a heat insulator.

9. The crystal oscillator according to claim 1 wherein an additional heating device is provided in an area enclosed by the heating device.

10. A method of producing a crystal oscillator, comprising:

arranging a heating device as surrounding an internal area of a substrate on at least one of the surfaces of the substrate; and arranging in an area enclosed by the heating device a crystal resonator, an oscillation circuit unit, a thermosensitive element which detects a temperature in the area, and a control unit for controlling a heating value applied to the heating device, wherein the crystal resonator and the oscillation circuit unit are arranged at positions opposite to each other and have the thermosensitive element therebetween.

11. The crystal oscillator according to claim 1, wherein:

the thermosensitive element is arranged at the center of the substrate to detect an external temperature change from outside the package at the same time for any transmission direction of the temperature change;

the crystal resonator is enclosed in the package of an airtight structure for a metal crystal resonator; and the temperature control unit controls the amount of heating of the heater such that the temperature detection value of the thermosensitive element can be a set value based on the temperature detection value detected by the thermosensitive element.

* * * * *

UNITED STATES PATENT AND TRADEMARK OFFICE
CERTIFICATE OF CORRECTION

PATENT NO. : 7,088,032 B2 Page 1 of 1
APPLICATION NO. : 11/154289
DATED : August 8, 2006
INVENTOR(S) : Oita et al.

It is certified that error appears in the above-identified patent and that said Letters Patent is hereby corrected as shown below:

In the Specification:

Col. 6, line 30, delete "Acrystal resonatorof" and insert --A crystal resonator of-- therefor Signed and Sealed this Third Day of April, 2007

JON W. DUDAS
*Director of the United States Patent and Trademark Office*